United States Patent [19]

Kinback et al.

[11] Patent Number: 5,201,696
[45] Date of Patent: Apr. 13, 1993

[54] APPARATUS FOR REPLACEMENT OF VACUUM NOZZLES

[75] Inventors: Jack A. Kinback, Binghamton; Paul M. Overby, Endicott, both of N.Y.

[73] Assignee: Universal Instruments Corp., Binghamton, N.Y.

[21] Appl. No.: 880,072

[22] Filed: May 5, 1992

[51] Int. Cl.$^5$ .................. B23Q 3/155; B23P 19/04; B66C 1/02
[52] U.S. Cl. ........................ 483/54; 29/743; 294/64.1; 483/902
[58] Field of Search ............... 483/54, 52, 50, 14, 483/69, 902; 29/740, 743; 414/736; 294/64.1, 65, 2; 901/41, 40

[56] References Cited

U.S. PATENT DOCUMENTS

| | | | |
|---|---|---|---|
| 3,467,430 | 9/1969 | Lowe | 294/64.1 X |
| 4,611,397 | 9/1986 | Janisiewicz | 29/740 X |
| 4,763,941 | 8/1988 | Sniderman | 294/64.1 |
| 4,799,854 | 1/1989 | Niskala | 483/69 X |
| 4,831,721 | 5/1989 | Hirai | 483/902 X |
| 5,033,783 | 7/1991 | Izumi et al. | 294/64.1 |
| 5,105,528 | 4/1992 | Soth et al. | 29/740 |
| 5,113,578 | 5/1992 | Jackson | 29/743 |

FOREIGN PATENT DOCUMENTS

| | | |
|---|---|---|
| 62-288594 | 12/1985 | Japan . |
| 62-261376 | 10/1987 | Japan . |
| 67799 | 3/1990 | Japan ........................ 29/740 |
| 194700 | 8/1990 | Japan ........................ 29/740 |

OTHER PUBLICATIONS

IBM Technical Disclosure Bulletin, vol. 28, No. 6 Nov. 1985 "Tool for Simultaneous Lifting of Semiconductor Circuit Chips".

*Primary Examiner*—William Briggs
*Attorney, Agent, or Firm*—Wegner, Cantor, Mueller & Player

[57] ABSTRACT

An adapter is attached to the end of a vacuum spindle in order to facilitate automated fastening and unfastening therewith of various vacuum nozzles. During fastening of a nozzle, vacuum is utilized to pull and hold the adapter and nozzle together with a force which is much greater than the mechanical detenting which is conventional in this art. The various nozzles may have component engaging tips of different sizes and configuration such that each nozzle is selectable as appropriate to the size and contour of the component to be held by vacuum drawn through the spindle. A novel reservoir housing a multiplicity of replaceable vacuum nozzles is also disclosed whereby the nozzles may be exchanged without any external separation or attachment force supplied by the downward or upward movement of the spindle.

14 Claims, 2 Drawing Sheets

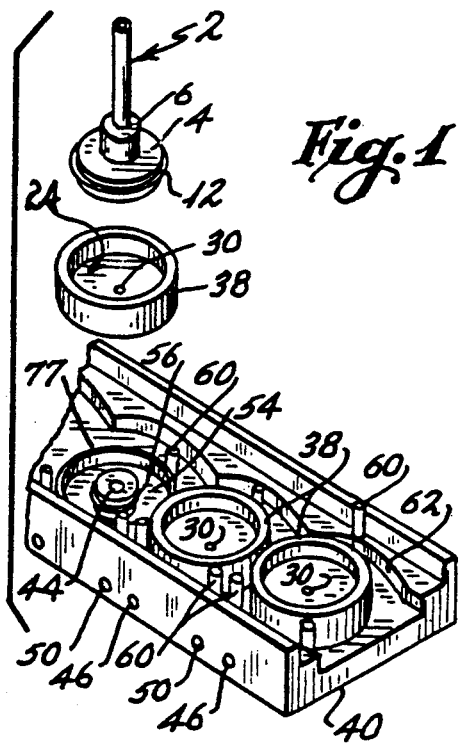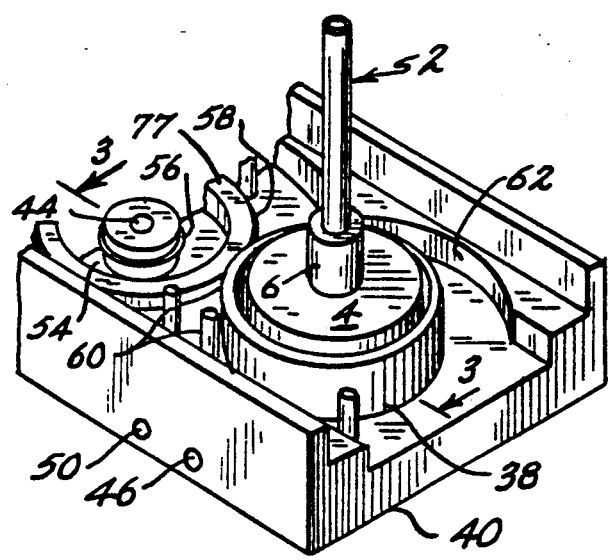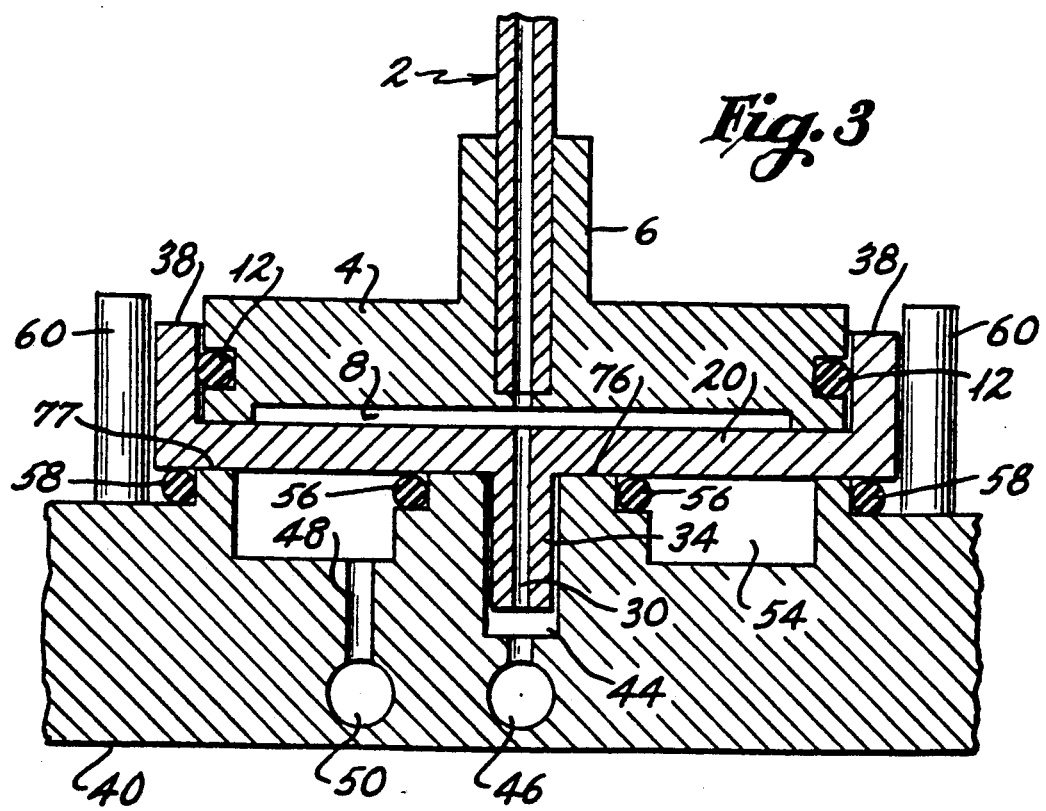

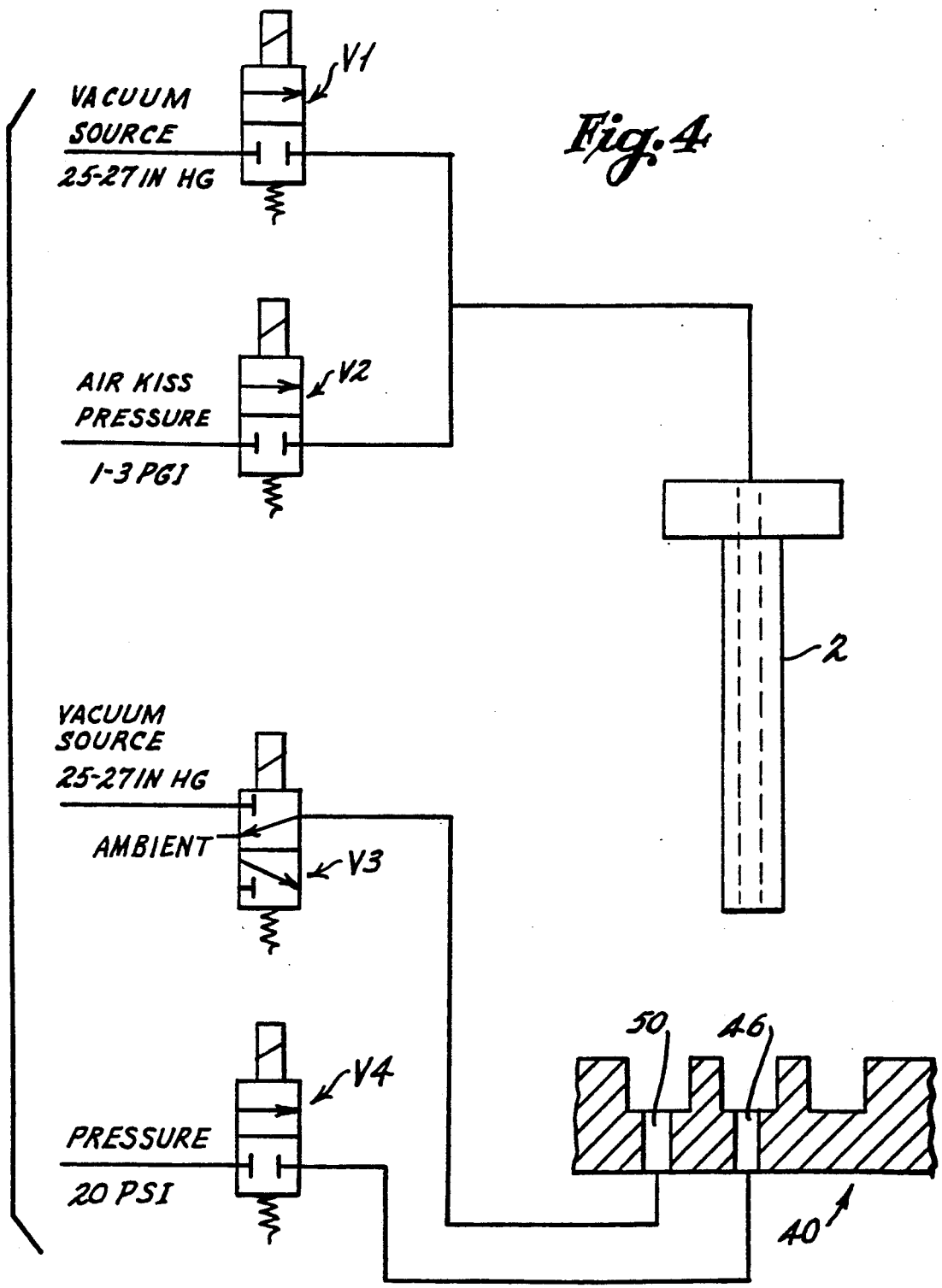

APPARATUS FOR REPLACEMENT OF VACUUM NOZZLES

PRIOR ART CROSS-REFERENCES

U.S. Pat. No. 5,105,528 issued Apr. 21, 1992, entitled METHOD AND APPARATUS FOR SUPPLYING AND CHANGING TIPS OF A PICK AND PLACE VACUUM SPINDLE, inventorship Henry J. SOTH et al.

Japanese Patent Laid-Open No. 62-261376, filed Oct. 16, 1987.

Japanese Patent Application No. 60-288594, filed Dec. 20, 1985.

BACKGROUND AND SUMMARY OF THE INVENTION

The invention is in the field of vacuum spindles for pick and place machines and generally is directed to automated exchange of tips of a vacuum spindle according to features, such as size and shape, of a component to be handled by the vacuum spindle.

Heretofore, vacuum spindles employing changeable tips have relied on friction detents biased into engagement between the spindle and tip to maintain their connection. Changing such nozzles has been accomplished by moving the spindle to position the already attached tip in an empty pocket of a tool changer, grasping and holding the tip mechanically in the tool changer, and retracting the spindle away from the pocket so as to overcome the force of the detent and thus strip the tip from the spindle. Next, the spindle would be repositioned over a pocket housing a selected replacement nozzle, and the spindle would be moved down with an engagement force sufficient to overcome the force of the detent and allow attachment of the nozzle and spindle.

This prior art connection is prone to a rotational "backlash" between the nozzle and spindle which is due, at least in part, to tolerances of the detent-type connection therebetween. Also, this type of connection is prone to so-called "runout" or rocking of the nozzle on the spindle such that the longitudinal axis of the nozzle is tilted relative to the longitudinal axis of the spindle.

These undesirable conditions generally are the result of limitations of the detent force which must be sufficient to hold the nozzle and spindle together and also be light enough to be overcome during the attachment and detachment process of placement machines described above.

Thus, an object of the invention is to improve the connection between the spindle and removable nozzles so that there is no angular backlash of the nozzle about the longitudinal axis of the spindle while a component is being held by the vacuum.

Also, it is an object of the invention to provide an improvement in the connection between the nozzle and spindle which substantially eliminates so-called "runout" or tilting of the longitudinal axis of the nozzle relative to the longitudinal axis of the spindle.

Additionally, it is an object of the invention to provide a connection between the nozzle and spindle by using an easily applicable and removable force of connection which is much greater than conventional detent-type forces while a component is being held by a vacuum.

Further, it is an object of the invention to eliminate the need for the mechanical separation and attachment forces during the exchange of nozzles between the vacuum spindle and nozzle replacement reservoir.

These and other objects of the invention will become more apparent from the remaining disclosure.

SUMMARY OF THE INVENTION

An adapter is attached to the end of a vacuum spindle in order to facilitate automated fastening and unfastening therewith of various vacuum nozzles. During fastening of a nozzle, vacuum is utilized to pull and hold the adapter and nozzle together with a force which is much greater than the mechanical detenting which is conventional in this art. The various nozzles may have component engaging tips of different sizes and configurations such that each nozzle is selectable as appropriate to the size and contour of the component to be held by vacuum drawn through the spindle. A novel reservoir housing a multiplicity of replaceable vacuum nozzles is also disclosed whereby the nozzles may be exchanged without any external separation or attachment force supplied by the downward or upward movement of the spindle. nozzles.

BRIEF DESCRIPTION OF THE DRAWINGS

FIG. 1 is an isometric view illustrating three stations of the replaceable nozzle holder, one station having a spindle and nozzle positioned overhead (with the nozzle shown as separated from the spindle only for purposes of illustration), the other two stations containing replacement nozzles.

FIG. 2 is a fragmentary isometric view of the replaceable nozzle holder with a nozzle situated at one station thereof and the adaptor of the spindle inserted therein.

FIG. 3 is a cross-section viewed generally in the direction of arrows 3—3 in FIG. 2.

FIG. 4 is a schematic diagram illustrating valved supply of positive and/or negative air to various parts of the inventive device.

DETAILED DESCRIPTION OF THE INVENTION

Referring to the drawings, an adaptor 4 has a shank 6 for attachment to the end of a vacuum spindle 2 of a pick and place head (not shown) for electronic components or the like. Adaptor 4 has an outside diameter much larger than that of spindle 2 in order to present a relatively large surface area on the face (the bottom as seen in FIG. 3) of adaptor 4 for use in providing a rigid connection between adaptor 4 and a removable nozzle 20 as will be described hereinafter. The face of adaptor 4 is recessed to define a plenum 8, and the periphery of adaptor 4 has a groove 10 in which is received an O-ring 12.

Each nozzle 20 has an upwardly protruding annular lip 38 which defines the boundary of a recess into which adaptor 4 is fitted for connection of nozzle 20 to the vacuum spindle 2. Nozzle 20 has a hole 30 disposed centrally with respect to recess 24 and communicating with tip 34 of the vacuum nozzle 20.

In the embodiment of FIG. 3, nozzle 20 may also be provided with a so-called "backlight" block of a lucite material or the like which, when irradiated with light, provides and excellent backdrop for an existing vision system used in checking the profile of the component and protruding leads against the profile and orientation of a model stored in memory. Alternatively, the material of a block or the bottom surface of nozzle 20 may be such that it is transparent, reflective, refractive or has other well known optical characteristics.

In order to be able to handle various sizes and shapes of components while using the same spindle 2 and adaptor 4, an array of replacement nozzles 20 are maintained at various stations 52 of the nozzle holder 40. Pins 60 of holder 40 are situated 120° apart around each station 52 so as to prevent side-ways dislodging of the nozzle 20 when the nozzle 20 is situated at a station.

As seen in FIGS. 1 and 3, each station 52 has a central recess 44 into which the nozzle tip 34 can protrude which, in turn, is in communication with a port 46. Station 52 also has an annular channel 54 communicating with a port 50.

Recess 44 is surrounded by a lip 76 which, in turn, is surrounded by an O-ring 56 which acts as a seal to isolate channel 54 from the central orifice of station 52. Channel 54 also has an upwardly protruding lip 77 surrounding it, and an O-ring 58 isolates channel 54 from the surrounding atmosphere. Both O-rings provide air tight sealing when the nozzle 20 is registered with station 52.

As seen in FIGS. 1 and 2, machinings 62 provided in holder 40 provide a larger locating diameter than defined by pins 60. The purpose of these machinings 62 is that, upon removal of the pins 60, a nozzle 20 of larger diameter will be received in machinings 62 to provide a station 52 for reception of a larger diameter replacement nozzle.

In use, when a component is blocking the tip 34, vacuum drawn on spindle 2 will evacuate the plenum 8 sufficiently to provide a rigid connection of adaptor 4 and nozzle 20. When a component or other means of closing the tip 34 of nozzle 20 (directly or indirectly) is not provided, then a non-rigid connection between adaptor 4 and spindle 20 is provided by the frictional engagement between O-ring 12 and lip 38. Alternatively, other means of providing frictional retention of nozzle 20 on adaptor 4 may be used.

Referring to FIG. 3 for pick-up of a nozzle 20 from holder 40, the spindle 2 and adapter 4 are coaxially aligned with the station 52 in which a selected nozzle is located and are then lowered until adapter 4 enters recess 24 of the selected nozzle 20. Then, upon closure of port 46, the air-tight seals of O-ring 12 with lip 38 and of O-ring 56 with the face of nozzle 20 provide that a vacuum drawn on spindle 2 via valve V1 can evacuate the chamber formed between adapter 4 and circular lip 38 of nozzle 20, causing a force which is sufficient to pull nozzle 20 into full seating engagement with adapter 4. This force of attraction is according to the following formula:

$$\text{Force} = \text{Pressure (negative psi)} \times \pi R^2, \quad (1)$$

where R is the inside radius of recess 24 of nozzle 20.

This force, which is generated upon application of vacuum, eliminates any requirement for spindle 2 to apply a downward force capable of overcoming the mechanical force normally associated with prior art nozzle reservoir devices during mating of a spindle and replacement nozzle.

In order to remove the newly attached nozzle 20 from holder 40, ports 46 and 50 of the corresponding station 52 are opened to the ambient and spindle 2 is retracted, carrying with it the mated nozzle 20. With the end of tip 34 uncovered and open to the ambient, the friction fit of O-ring 12 within lip 38, or a similar friction or detenting method, keeps the adapter 4 and nozzle 20 mechanically connected in the absence of vacuum and even with a lightly pressurized air kiss introduced through spindle 2 via valve V1.

At a component supply station (not shown), spindle 2 is moved downwardly until nozzle tip 34 contacts the top surface of a component, thus blocking the tip of nozzle 20. Therefor, a vacuum pulled through spindle 2 increases the force of attachment between adapter 4 and nozzle cavity 24, while also holding the component on the nozzle tip 34. As can be seen in FIG. 3, plenum 8 is several times larger in diameter than the vacuum channel through spindle 2, so as to create a very large clamping force for holding together the adapter 4 and nozzle 20. This force can be calculated by means of formula (1), but with R being the inside radius of plenum 8.

For example, a vacuum force of $-13$ psi acting in plenum 8 having a radius of 0.5 inches will produce a clamping force of over 10 pounds. This relatively high force is several times greater than that which can be achieved with only the typical mechanical detents, and it results in the following advantages: (i) rotational backlash between nozzle 20 and spindle 2 is obviated, and (ii) nozzle 20 is brought into precise planar alignment with the bottom surface of adapter 4 which surrounds plenum 8 so as to eliminate any possible tilting of the longitudinal axis of nozzle tip 34 relative to the longitudinal axis of spindle 2.

To place a nozzle 20 carried by spindle 2 on holder 40, spindle 2 is coaxially aligned with a selected, empty station 52 of holder 40, and then is advanced downwardly until the bottom surface of nozzle 20 contacts O-rings 56 and 58 of station 52. Then, vacuum applied via valve V3 to channel 54 and through port 50 imposes a holding force to nozzle 20. Coincidingly, positive air pressure applied via valve V4 through port 46 and/or through spindle 2 acts within the chamber formed between adapter 4 and circular lip 38 of nozzle 20 as a separation force which may be calculated by use of formula (1), using positive rather than negative values of pressure. After the nozzle 20 has been separated from adapter 4, the positive pressure on port 46 and the vacuum on port 50 are no longer required and may be disconnected by valving, such as valves V3 and V4 of FIG. 4.

Therefore, separation of nozzle 20 from adapter 4 can take place without any mechanical clamping of nozzle 20 to holder 40 or any upward vertical force being applied by spindle 2 in order to overcome any detent force between nozzle 20 and adapter 4. Thus, a much simpler design of holder 40 is provided and a spindle may be used which is very light weight and delicate for handling of fragile electronic components. Additionally, strong forces of attraction and repulsion between nozzle 20 and adapter 4 are easily applied and removed as required.

Thus, the objects set forth above, among those made apparent from the preceding description, are efficiently attained and, since certain changes may be made in the construction set forth without departing from the scope of the invention, it is intended that all matter contained in the above description or shown in the accompanying drawings shall be interpreted as illustrative and not in a limiting sense.

Therefore, it is contemplated that the structure for presenting an increased area over which the forces of attraction and repulsion can act may be different in shape and location than illustrated herein.

The following claims are intended to cover all of the generic and specific features of the invention herein described and all statements of the scope of the invention which as a matter of language, might be said to fall therebetween.

Now that the invention has been described, we claim:

1. In a pick and place machine for mounting electronic components on printed circuit boards or substrates wherein a vacuum nozzle mounted on a spindle containing a vacuum conduit is utilized to pick-up a component from a feeder and place it on said board or substrate, the improvement comprising:
   a replaceable vacuum nozzle having a depending tip, an upper planar surface, and a pneumatic conduit therethrough;
   an adapter mounted on said spindle, said adapter having a lower planar surface and a pneumatic conduit therethrough;
   at least one of said planar surfaces having a lip projecting therefrom so as to define a recess; and
   means for applying vacuum to said tip, through said recess, so as to provide that a means for vacuum holding said component is combined with a means for vacuum fastening together said adapter and nozzle.

2. The improvement as in claim 1, and further comprising:
   a source of air under negative pressure providing said vacuum;
   a first valve means for connecting said vacuum to and disconnecting said vacuum from said spindle, selectively;
   a source of air under positive pressure; and
   second valve means for connecting said air under positive pressure to and disconnecting said air under positive pressure from said spindle.

3. The improvement as in claim 1, and further comprising:
   means for providing a generally nonrigid connection between said spindle and said nozzle, said nonrigid connection being sufficient to retain said nozzle on said spindle even when said tip of said nozzle is open to ambient atmosphere.

4. The improvement as in claim 1, wherein at least one of said planar surfaces has a plenum, and seal means are included between said nozzle and adapter for providing an air tight seal.

5. The improvement as in claim 4, wherein said seal means further comprises:
   an O-ring.

6. The improvement as in claim 1, and further comprising:
   means for warehousing nozzles which are not attached to said spindle, said warehousing means having stations for receiving nozzles; and
   means for evacuating a portion of each said stations via vacuum, when a nozzle is placed thereat by said spindle, sufficiently to retain said nozzle on said station during un-fastening of said spindle.

7. The improvement as in claim 4, and further comprising:
   means for warehousing nozzles which are not attached to said spindle, said warehousing means having stations for receiving said nozzles; and
   means for introducing positive air pressure into said plenum in order to disconnect and thus remove said nozzle from said spindle upon disconnecting said vacuum from said spindle.

8. The improvement as in claim 7, wherein each said station comprises:
   recess means for receiving a tip of a nozzle;
   means for sealing said recess means with said nozzle around said tip; and
   means for connecting said positive air pressure introducing means to said recess means upon sealing said recess means with said nozzle.

9. The improvement as in claim 8, and further comprising:
   said stations of said nozzle warehousing means being adaptable in order to accommodate nozzles of various sizes.

10. In a pick and place machine for mounting electronic components on printed circuit boards or substrates wherein a vacuum nozzle mounted on a spindle containing a vacuum conduit is utilized to pick-up a component from a feeder and place it on said board or substrate, the improvement comprising:
    a replaceable vacuum nozzle having a depending tip, an upper planar surface, and a pneumatic conduit therethrough;
    an adapter mounted on said spindle, said adapter having a lower planar surface and a pneumatic conduit therethrough;
    at least one of said planar surfaces having a lip projecting therefrom so as to define a recess;
    a source of air under negative pressure providing said vacuum;
    a first valve means for connecting said vacuum to and disconnecting said vacuum from said spindle, selectively;
    a source of air under positive pressure; and
    second valve means for connecting said air under positive pressure to and disconnecting said air under positive pressure from said spindle;
    whereby upon engagement of said nozzle and adapter in the presence of vacuum, said planar surfaces are abutted and said adapter and nozzle are fastened together.

11. In a pick and place machine for mounting electronic components on printed circuit boards or substrates wherein a vacuum nozzle mounted on a spindle containing a vacuum conduit is utilized to pick-up a component from a feeder and place it on said board or substrate, the improvement comprising:
    a replaceable vacuum nozzle having a depending tip, an upper planar surface, said a pneumatic conduit therethrough;
    an adapter mounted on said spindle, said adapter having a lower planar surface and a pneumatic conduit therethrough;
    at least one of said planar surfaces having a lip projecting therefrom so as to define a recess; and
    means for providing a generally nonrigid connection between said adapter and said nozzle, said nonrigid connection being sufficient to retain said nozzle on said spindle even when said tip of said nozzle is open to ambient atmosphere;
    whereby upon engagement of said nozzle and adapter in the presence of vacuum, said planar surfaces are abutted and said adapter and nozzle are fastened together.

12. In a pick and place machine for mounting electronic components on printed circuit boards or substrates wherein a vacuum nozzle mounted on a spindle containing a vacuum conduit is utilized to pick-up a component from a feeder and place it on said board or substrate, the improvement comprising:

a replaceable vacuum nozzle having a depending tip, an upper planar surface, and a pneumatic conduit therethrough;

an adapter mounted on said spindle, said adapter having a lower planar surface and a pneumatic conduit therethrough;

at least one of said planar surfaces having a lip projecting therefrom so as to define a recess; and said adapter having a plenum which is situated in said lower planar surface generally oppositely of said nozzle planar surface and an O-ring is included between said nozzle and said adapter for providing an air tight seal;

whereby upon engagement of said nozzle and adapter in the presence of vacuum, said planar surfaces are abutted and said adapter and nozzle are fastened together.

13. In a pick and place machine for mounting electronic components on printed circuit boards or substrates wherein a vacuum nozzle mounted on a spindle containing a vacuum conduit is utilized to pick-up a component from a feeder and place it on said board or substrate, the improvement comprising:

a replaceable vacuum nozzle having a depending tip, an upper planar surface, and a pneumatic conduit therethrough;

an adapter mounted on said spindle, said adapter having a lower planar surface and a pneumatic conduit therethrough;

at least one of said planar surfaces having a lip projecting therefrom so as to define a recess;

said adapter having a plenum which is situated in said lower planar surface generally oppositely of said nozzle planar surface and seal means are included between said nozzle and said adapter for providing an air tight seal, whereby upon engagement of said nozzle and adapter in the presence of vacuum, said planar surfaces are abutted and said adapter and nozzle are fastened together;

means for warehousing nozzles which are not attached to said adapter, said warehousing means having stations for receiving said nozzles; and means for introducing positive air pressure into said plenum in order to disconnect and thus remove said nozzle from said adapter upon disconnecting said vacuum from said spindle.

14. In a pick and place machine for mounting electronic components on printed circuit boards or substrates wherein a vacuum nozzle mounted on a spindle containing a vacuum conduit it utilized to pick-up a component from a feeder and place it on said board or substrate, the improvement comprising:

a replaceable vacuum nozzle having a depending tip, an upper planar surface, and a pneumatic conduit therethrough;

an adapter mounted on said spindle, said adapter having a lower planar surface and a pneumatic conduit therethrough;

at least one of said planar surfaces having a lip projecting therefrom so as to define a recess, whereby upon engagement of said nozzle and adapter in the presence of vacuum, said planar surfaces are abutted and said adapter and nozzle are fastened together;

means for warehousing nozzles which are not attached to said adapter, said warehousing means having stations for receiving nozzles; and means for evacuating a portion of each of said stations via vacuum, when a nozzle is placed against by said spindle, sufficiently to retain said nozzle on said station during retraction of said spindle.

* * * * *